(12) United States Patent
Travers et al.

(10) Patent No.: US 10,071,527 B2
(45) Date of Patent: Sep. 11, 2018

(54) COLOUR 3-DIMENSIONAL PRINTING WITH 3D GAMUT MAPPING

(71) Applicant: Mcor Technologies Limited, Dunleer, Co. Louth (IE)

(72) Inventors: James Travers, Rush (IE); Philip Keenan, Baldock (GB); Fintan MacCormack, Ardee (IE); Conor MacCormack, Ardee (IE)

(73) Assignee: MCOR TECHNOLOGIES LIMITED, Dunleer, County Louth (IE)

( * ) Notice: Subject to any disclaimer, the term of this patent is extended or adjusted under 35 U.S.C. 154(b) by 726 days.

(21) Appl. No.: 14/403,061

(22) PCT Filed: May 22, 2013

(86) PCT No.: PCT/EP2013/025003
§ 371 (c)(1),
(2) Date: Nov. 21, 2014

(87) PCT Pub. No.: WO2014/015994
PCT Pub. Date: Jan. 30, 2014

(65) Prior Publication Data
US 2015/0134096 A1 May 14, 2015

(30) Foreign Application Priority Data
May 22, 2012 (GB) .................................. 1208993.4

(51) Int. Cl.
*B29C 64/223* (2017.01)
*B29C 67/00* (2017.01)
(Continued)

(52) U.S. Cl.
CPC ........ *B29C 67/0088* (2013.01); *B29C 64/141* (2017.08); *B29C 64/223* (2017.08);
(Continued)

(58) Field of Classification Search
CPC ............ B29C 67/0074; B29C 67/0088; B29C 64/141; B29C 64/223; B29C 64/386; B33Y 30/00; B33Y 40/00; B33Y 50/00
See application file for complete search history.

(56) References Cited

U.S. PATENT DOCUMENTS 5,015,312 A  5/1991  Kinzie
6,506,477 B1  1/2003  Ueda et al.
(Continued)

FOREIGN PATENT DOCUMENTS

CN  101814188 A  8/2010
EP  1415791 A1  5/2004
(Continued)

*Primary Examiner* — Yogendra N Gupta
*Assistant Examiner* — Joseph S Leyson
(74) *Attorney, Agent, or Firm* — Schwabe Williamson & Wyatt, PC

(57) ABSTRACT

Provided is a Layered Object Manufacturing, LOM, system configured to form a colored three-dimensional (3D) object, the system comprising: a 3D object gamut mapping module configured to define a 3D object formed from a plurality of surfaces and provide a printing regime consistent with the defined 3D object, wherein the 3D object gamut mapping module is configured to analyze the orientation of a surface of each of a plurality of media layers to be printed in order to adaptively modify the color printed to that layer; and a printer configured to color print at least a portion of a first surface of each of the plurality of layers in accordance with the printing regime. Also provided is a color 3D object media layer printing module for providing a print-through region in a 3D object media layer. Also provided is a 3D object gamut mapping method, and ink for use in a Layer Object Manufacturing (LOM) system including the printing module.

22 Claims, 19 Drawing Sheets

(51) Int. Cl.
  *G05B 15/02*   (2006.01)
  *G06F 17/50*   (2006.01)
  *B29C 64/141*  (2017.01)
  *B29C 64/386*  (2017.01)
  *B33Y 30/00*   (2015.01)
  *B33Y 40/00*   (2015.01)
  *B33Y 10/00*   (2015.01)
  *B33Y 50/02*   (2015.01)

(52) U.S. Cl.
  CPC ............ *B29C 64/386* (2017.08); *G05B 15/02* (2013.01); *G06F 17/50* (2013.01); *B33Y 10/00* (2014.12); *B33Y 30/00* (2014.12); *B33Y 40/00* (2014.12); *B33Y 50/02* (2014.12)

(56) References Cited

U.S. PATENT DOCUMENTS

| | | |
|---|---|---|
| 2004/0080078 A1 | 4/2004 | Collins |
| 2009/0303507 A1 | 12/2009 | Abeloe |
| 2010/0174392 A1* | 7/2010 | Fink .................. B29C 67/0077 700/104 |
| 2011/0094441 A1* | 4/2011 | MacCormack ....... B05C 1/0808 118/204 |
| 2011/0222081 A1 | 9/2011 | Yi et al. |

FOREIGN PATENT DOCUMENTS

| | | |
|---|---|---|
| EP | 2141003 A2 | 1/2010 |
| JP | 2002292752 A | 10/2002 |
| JP | 2010074317 A | 4/2010 |

* cited by examiner

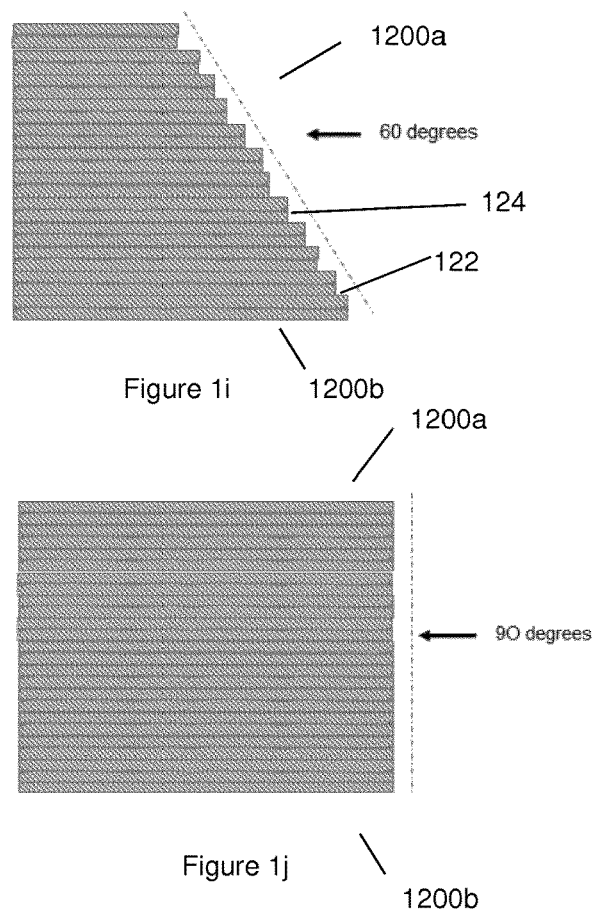
Figure 1i
Figure 1j
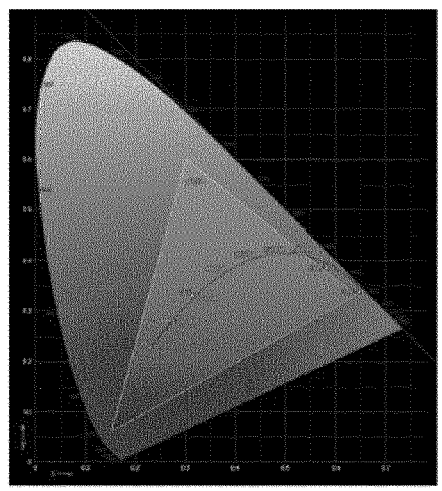
Figure 1k

Front Image Alignment Target

Rear Image Alignment Target with rear illumination

COLOUR 3-DIMENSIONAL PRINTING WITH 3D GAMUT MAPPING

FIELD OF THE INVENTION

The present teaching relates to Layered Object Manufacture (LOM) systems for rapid prototyping (RP), and in particular to a printing module and a 3D object gamut mapping method for printing 3-Dimensional (3D) object layers to form a colour 3D object in a LOM system. The present teaching also provides an ink for use in such an LOM system.

BACKGROUND

Rapid prototyping is defined as computer-controlled additive fabrication, in that an object can be fabricated by the addition of material rather than conventional machining methods that rely on removal or the subtraction of material. The term "rapid" is, it will be appreciated, a relative term but one that has specific meaning within the art, in that construction of a finished three dimensional articles can take from several hours to several days, depending on the method used and the size and complexity of the model. There are many known methodologies that are employed within the general field of rapid prototyping Layered Object Manufacture (LOM) is one form of Rapid prototyping (RP) which relates to the successive layering of adhesive-coated paper, plastic, or metal laminates which are then successively glued together and cut to shape with a knife or laser cutter.

LOM, similarly to other rapid prototyping techniques, conventionally involves the use of a three dimensional (3D) computer aided design (CAD) of an object/part to be made, from which a stereolithography (STL) or other suitable format file is generated within a CAD package. The STL file is processed and in effect virtually sliced in the Z-axis at a thickness matching the thickness of the substrate material used. This creates a series of cross sections of the part and at any particular height each one has a simple two dimensional (2D) profile. A profiling, or cutting, apparatus may be used to trace the 2D profiles and thus cut the shapes onto thin sheets of raw material. In LOM, each individual thin sheet may be stacked and bonded one on top of another to produce a finished 3D object. The order of the profiling, stacking and bonding processes may be interchanged.

Colour 3D printing involves applying colour digitally to each of the layers used in the fabrication of a 3D printed article. Colour is required at the required intensity on each surface of the final 3D printed article as follows:
- the front surface—the uppermost surface of the printed media
- the rear surface—the underside surface of the printed media
- the profiled edge—the edge of the media that has been cut according to the digital profile for that layer in the 3D article It is desirable that the ink is absorbed by the media layer, such as paper, through its entire thickness (referred to as strike through or print through) as each object layer requires colour throughout its volume. However, in conventional colour 3D printing, the ink tends to percolate throughout the open porosity of the media causing the image to spread beyond the initial contact area that the ink has with the media. This is particularly problematic when 3D colour printing takes place from one side of the media alone.

For example as shown in FIG. 1a, inkjet printing colour 80a onto a medium such as a powder layer 120 using a conventional 3D colour printer relies on printing from one side only. During the ink absorption process, the ink 80a spreads into the thickness of the layer 120 and continues to spread into a wider area than the original contact area, as indicated in FIG. 1b. In addition there is no physical barrier to prevent the ink to continue to spread into a previously printed layer 130 beneath the target layer 120, which may lead to an intermixing of printed layers, as illustrated in FIG. 1b. The intermixing region is designated by reference numeral 80c. Both spread of ink and layer intermixing causes a degradation in image acuity, that is, blurring of image and diffuse colours. FIG. 1c illustrates the finished object, comprising diffuse surfaces and colour mixing regions 80c. It will be appreciated such a solution, while providing colour within the 3D environment does not provide an optimal solution. In addition, referring to FIG. 1d, by printing from one side only of the media layer, it is necessary to print adjacent dots sufficiently close together so as to ensure no areas of the media layer are left unprinted particularly on the lower layer surface. By bringing ink dots together, their subsequent bleed in the X and Y in-plane will cause them to converge and produce a mixed colour typically appearing as a brown or black. To avoid colour mixing, the printing density must be reduced to avoid the intermixing of inks, and this would result in surfaces that have a lower than optimal ink drop density, as illustrated in FIG. 1e.

In another aspect of conventional inkjet printing, the media is treated with a sizing agent or filler, to render the media physically less susceptible to the migration of ink, from the front printed side, to the rear side of the media by reducing the amount of porosity available for ink to find pathways for flow. Surface sizing agents (applied to the media surface) may be modified starches, hydro colloids such as gelatine, or alkyl ketene dimers, which are amphipathic molecules with hydrophilic ends facing the cellulose fibres, and hydrophobic tails facing out towards the ink, creating a degree of water repellency and resistance to ink flow and penetration. Typical ink used in inkjet printing uses water as the predominant solvent.

In colour 3D printing it is desirable that the ink fully saturates the media so that the paper is coloured in three dimensions. There are limitations in the types of media, such as paper, that are suitable for use in conventional LOM systems. As paper is composed of a randomly felted layer of fibre, it follows that the structure may have varying degrees of porosity. Paper is a highly porous material and contains as much as 70% air. The porosity of a sheet is an indicator of the moisture absorption capacity of the paper, or the ability of a particular sheet of paper to accept ink or water. When selecting a particular type of paper for LOM, it is therefore important to consider the porosity of the media.

Commonly, ink used in desktop inkjet printing onto paper is water based, with binders, and dyes or pigments imparting colour.

After a plurality of media object layers are formed, a profiling and layer bonding process is performed. The plurality of layers are bonded together, and then a profiling or weeding process is performed which comprises removing unwanted support material from the printed media stack to reveal the 3D printed object. Conventionally, during the weeding process, a technician performing the task has to observe a 3D model object on a computer screen as he/she removes the unwanted layers during weeding.

In colour 3D printing, there are three facets to each media layer, the horizontal front side (face up), the horizontal rear side (facing down) and the profiled (cut) vertical walls. Each surface of the finished 3D object may have varying percentages of front/back/vertical surface area exposed to light. There may be slight variations in colour intensity between the front/back surfaces when compared to the angled walls of the 3D object.

These variations may depend on the nature of the faceting of the wall (a mixture of vertical and horizontal surfaces), and may depend on two contributing factors:

1. The ink which is printed from both sides of the media layer may not penetrate to the centre of the media layer edge uniformly. This means that there will be a component of the media layer colour in the resultant visual effect, thus generally reducing colour saturation.
2. Shading due to the step caused by a media layer edge may serve to darken the printed colour. However, this is subjective and may depend on the viewing angle and the angle of the light source to the surface in question. Accordingly, it is assumed that both the light source and viewing angle are normal to the surface. In this case, shading is not a contributing factor.

FIG. 1f illustrates a stack of printed media layers 1200 oriented with respect to a light source. The horizontal top and bottom surfaces 1200a and 1200b present themselves to the incident light with no facets and a uniform optical intensity profile. In FIG. 1g, the top surface 1200a is oriented at 30 degrees to the horizontal plane, which presents a mixture of horizontal walls 122 (predominantly) and vertical walls 124 including page edges in the step regions that reflect more light than planar, non-faceted surfaces. In FIG. 1h, the top surface 1200a is oriented at 45 degrees to the horizontal plane, which may produce a more equal mix of horizontal and vertical walls 122 and 124 and a higher frequency of steps per unit area. FIG. 1i shows steeper walls (60 degrees to the horizontal plane), which yields more vertical walls 124 than horizontal walls 122, and an increase in facets. In the last example in FIG. 1j, the surface is comprised entirely of vertical facets with the light source oriented at 90 degrees to the vertical facets. In FIG. 1j, the surface facing the incident light has a topography different to the horizontal surfaces 1200a and 1200b and is a multi-laminate structure.

A colour gamut describes the range of visual stimulus which can be represented by a device or image format, or that range which may be perceived by an input device such as a camera or indeed a human viewer. A commonly used representation is the CIE 1931 XY chromaticity diagram as shown in FIG. 1k. The axes represent the XY colour space coordinates with colour wavelengths depicted around the locus of the gamut. The larger lobe-shaped gamut represents the extents of human visual perception; also depicted is an example sRGB device gamut which is significantly smaller. The gamut for a colour printer is typically smaller again and more irregular in shape due to the use of four component inks versus the tri-stimulus sRGB space.

When attempting to print an image which is represented in a typical computer monitor output format a problem arises. A large area of the monitor gamut will not be available to the printing device so the field of gamut-mapping comes into play in transforming colours of one device gamut onto another. A naive approach would be to preserve all colours common to both gamuts and then remap all outlying colours of the input gamut to the nearest edge of the output gamut. This would preserve accuracy for some colours but for others would map all outlying values to a small set of colours along the output gamut edge. The poor visual effect which results from this means that other less colour accurate approaches are generally used.

The above description pertains to traditional 2D imagery as applied to 2D paper printers, colour monitors, etc. When considering the field of 3D-manufacturing in colour, another dimension to the above mapping arises; i.e. that of a potential colour dependency to a particular physical orientation or orientations. This may arise in Layered Object Manufacturing (LOM) based rapid-prototyping using paper, but also other 3D printing technologies. The physical orientation dependency in this case arises due to the possibility that ink may not fully penetrate the paper. This means that for a saturated colour on one or both paper surfaces there may be a component of the paper colour combining with the ink to produce an altered visual effect when viewed from the page edge.

In FIG. 1l the problem is represented for the case of a stack of bonded paper which has been duplex coloured; the inks have not fully penetrated, so the base colour of the paper is still present in the middle of the page thickness. This is not a problem in the 0° viewing angle shown as only the top-surface of the paper is visible; the effect will be the same as for a 2D print of the same colour. When viewed from the side, however, or at 90°, the paper colour component comes into play from the part of the profile where ink has not penetrated. The visual effect would be of a colour mix between the base paper colour and the printed green: something approximating a desaturated version of the original printed colour.

The effect of this de-saturation could be a visible break in colour uniformity across different angled facets of a part.

There are therefore a number of problems with colour 3D printing processes for use in LOM systems for rapid prototyping that need to be addressed.

SUMMARY

These and other problems are addressed by a Layered Object Manufacturing (LOM) system configured to perform a colour 3D printing process provided in accordance with the present teaching.

Accordingly the present teaching provides a LOM system as detailed in claim 1. Also provided is a printing module in accordance with claim 34. Also provided is a 3D object gamut mapping method in accordance with claim 60. Further provided is a computer software program in accordance with claim 75. Also provided are an ink and medium for colour 3D printing according to claims 78 and 83, respectively. Still further provided is another LOM system according to claim 84. Advantageous features are provided in the dependent claims.

These and other features of the present invention will be better understood with reference to the following drawings.

BRIEF DESCRIPTION OF THE DRAWINGS

The present invention will now be described with reference to the accompanying drawings in which:

FIG. 1j is a sectional view of a stack of media layers comprised entirely of vertical facets;

FIG. 1k illustrates the CIE 1931 XY chromaticity diagram;

FIG. 1l illustrates a stack of colour printed paper in which the inks have not fully penetrated the entire thickness of the layers;

DETAILED DESCRIPTION OF THE DRAWINGS

Figure 1A:
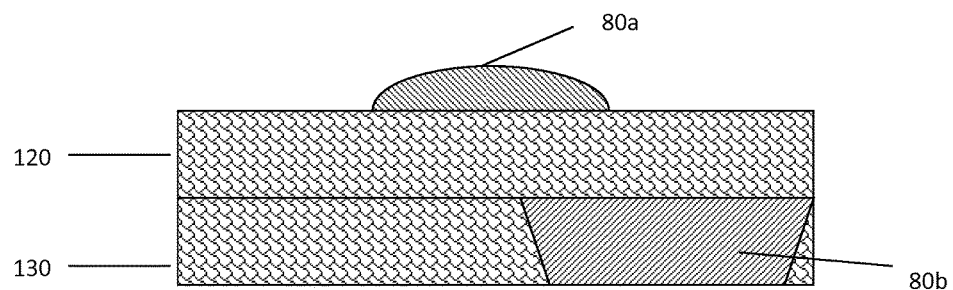
FIG. 1a is a sectional view illustrating inkjet printing colour onto a gypsum layer according to a conventional process.
Figure 1B:
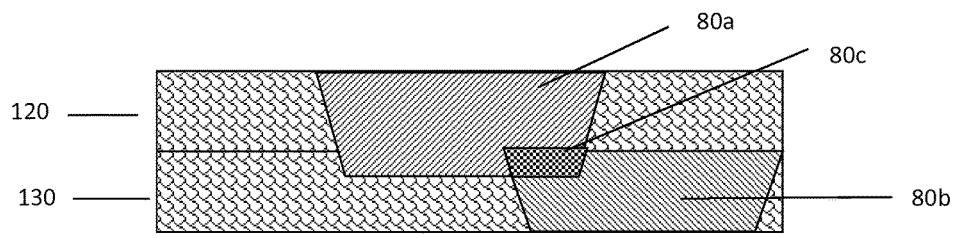
FIG. 1b illustrates ink from a current printed layer interacting with a previous layer in a conventional process.
Figure 1C:
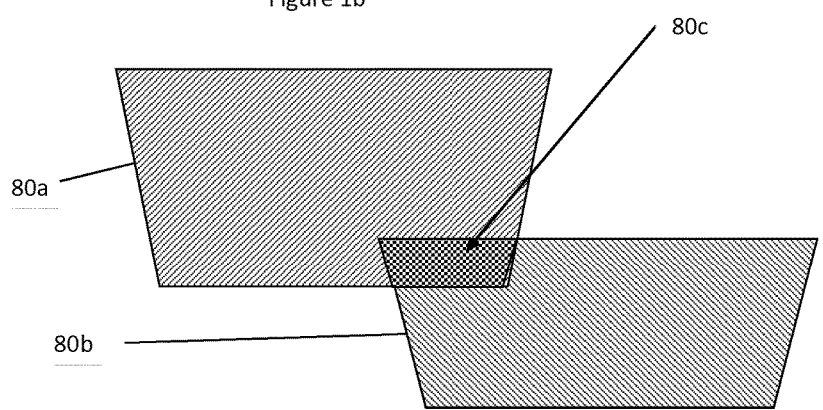
FIG. 1c illustrates a finished object obtained using the conventional process, showing diffuse surfaces, and colour mixing regions.
Figure 1D:
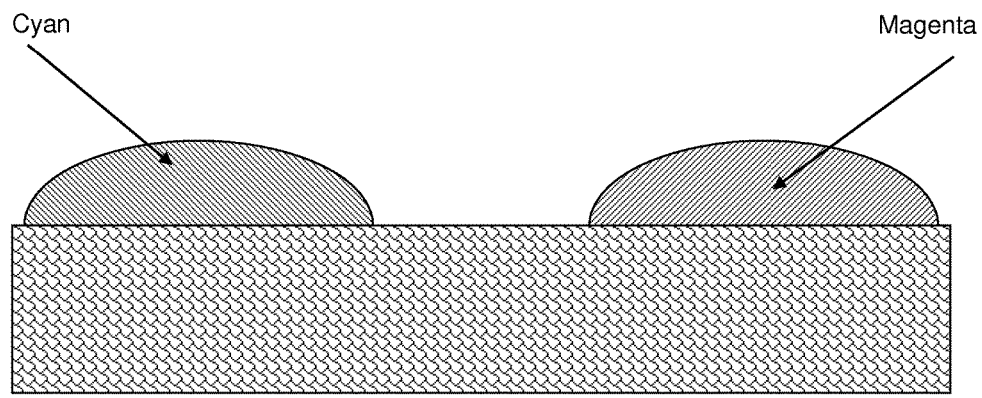
FIG. 1d illustrates a conventional process of printing on one side only of a media layer.
Figure 1D:
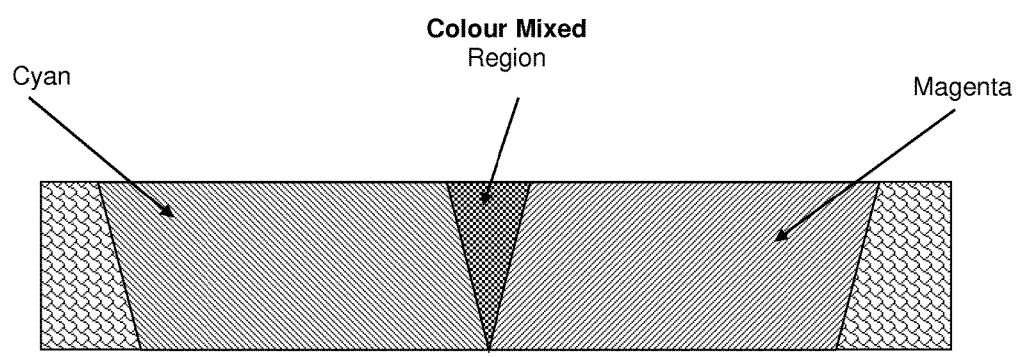
Figure 1E:
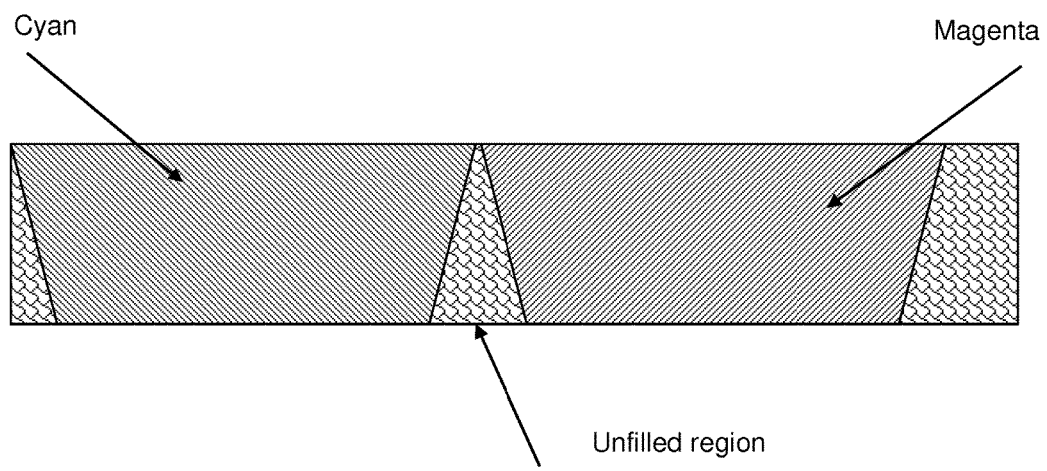
FIG. 1e illustrates a conventional process of printing colour dots on one side only of a media layer.
Figure 1F:
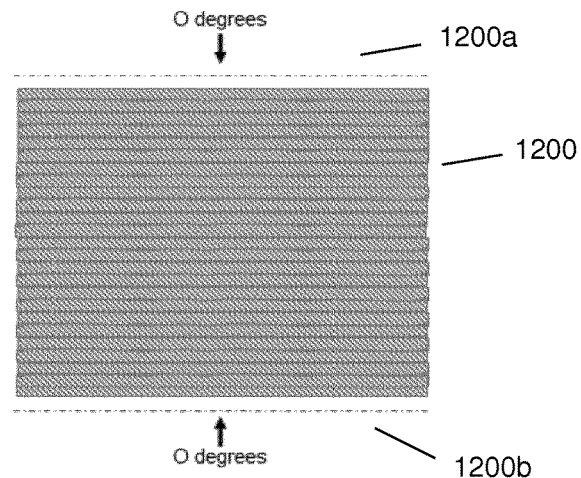
FIG. 1f is a sectional view of a stack of media layers having horizontal top and bottom surfaces, oriented to incident light such as to include no facets and having a uniform optical intensity profile.
Figure 1G:
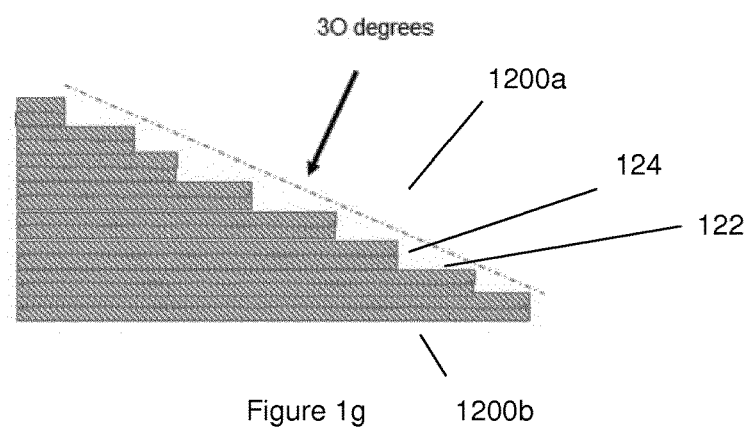
FIG. 1g is a sectional view of a stack of media layers with the top surface oriented at 30 degrees to the horizontal plane, the stack presenting a mixture of horizontal (predominantly) and vertical walls including page edges in the step regions (circled) that reflect more light than planar, non-faceted surfaces.
Figure 1H:
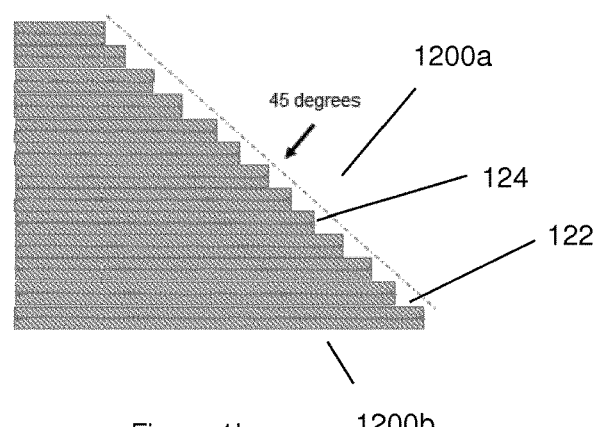
FIG. 1h is a sectional view of a stack of media layers with the top surface oriented at 45 degrees to the horizontal plane, the stack presenting a more equal mixture of horizontal and vertical surfaces and a higher frequency of steps per unit area.
Figure 1I:
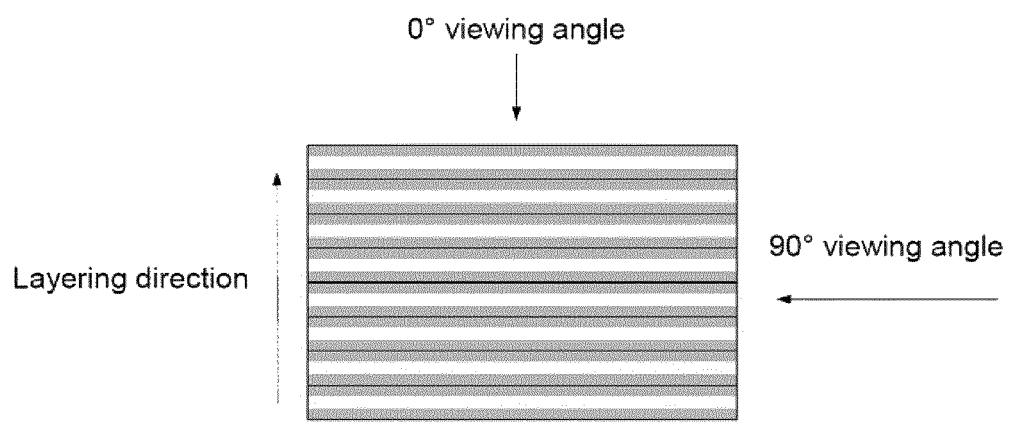
FIG. 1i is a sectional view of a stack of media layers with the top surface oriented at 60 degrees to the horizontal plane, the stack presenting more vertical than horizontal surfaces and an increase in facets.

Exemplary arrangements of a Layer Object Manufacturing (LOM) system provided in accordance with the present teaching will be described hereinafter to assist with an understanding of the benefits of the present teaching. Such arrangements will be understood as being exemplary of the type of systems that could be provided and are not intended to limit the present teaching to any one specific arrangement as modifications could be made to that described herein without departing from the scope of the present teaching.

In one aspect of the present teaching, a Layered Object Manufacturing (LOM) system configured to assemble a plurality of individual layers to form a coloured three-dimensional (3D) object is provided. Within the context of the present teaching, where the layers are media layers, the individual media layers may be considered distinct physical elements or entities. In this way they may be individually picked and placed or otherwise transported within the system. In another configuration the layers may be formed in situ during the building of the 3d object for example using a gypsum material. They are individually identifiable but are not formed until the build of the object.

The system may comprise a printer configured to colour print at least a portion of a first surface of each of a plurality of layers. Where the layers are media layers the system may further comprise a collator configured to assemble the plurality of the individual media layers to form the 3D object. Each of the individual media layers may be individually or independently printed.

A printing module for printing 3D object media layers for forming a 3D object may be provided. The present teaching also provides a LOM system including the printing module and a profiling and layer bonding module for cutting the individual 3D object media layers and bonding the individual layers together to form the finished 3D object. Also provided is a 3D object gamut mapping method for normalizing the overall colour intensity of all surfaces of a 3D object media layer. Also provided is an ink for colour 3D printing. The present teaching also provides a colour 3D offset printing process for printing additional information on each layer. This information provides error correction and build instructions to the profiling and layer bonding module for profile cutting the stack of colour printed layers.

The printing module may be a physically separate processing module from the collator that would conventionally form part of a LOM arrangement. Such an example is in our co-assigned application PCT/EP2008/66473. In one embodiment, the printing module may comprise an inkjet printer equipped with a duplex module to automatically invert the media when printing on its back surface. The printer may be configured to apply the colour prior to collation. The colour may also be applied during the collation process. The colour is applied through use of different inks. The collator may comprise a bonding module configured to bond individual ones of the plurality of media layers. The bonding module may be configured to use a water-based adhesive. The printer may be configured to print on first and second surfaces of the media layers. The printing on first and second surfaces operably reduces image bleed and preserves colour accuracy regardless of angle of the object's surface. The printer may be configured to apply multiple colours to one or more surfaces of one or more of the plurality of individual media layers. The collator may comprises a profiling module configured to effect a profiling of individual ones of the plurality of media layers to effect a desired 3D shape within the 3D object. The profiling module and the bonding module may be integrated in a single profiling and layer bonding module.

Suitable printers may include office printers that have large capacity input and output trays and come with duplex units as standard. The printing module 100 may also be integrated into the profiling and layer bonding module, such that the colour printing immediately precedes the profiling and bonding processes.

In accordance with the present teaching the printing ink utilised within the printing module may be optimised to penetrate most cellulose media types. Examples of such an ink will be described later. The colour printing process will now be described in detail.

In accordance with the present teaching a finished 3D object is formed from a stack of individual media layers which are assembled and profiled to form the desired final geometrical shape. In a preferred arrangement the individual media layers are sheets of cellulose based paper which may be printed or otherwise treated prior to the assembly arrangement. Accordingly, a plurality of 3D object media layers—such as the exemplary cellulose based paper, may be printed in preparation for forming the finished colour 3D printed article. The entire layer stack for the colour 3D printed article may be duplex pre-printed off-line in the printing module, after which the printed stack may be loaded into a profiling and layer bonding module where each printed layer may be profiled and bonded to complete the fabrication of the colour 3D printed article.

Figure 2A:
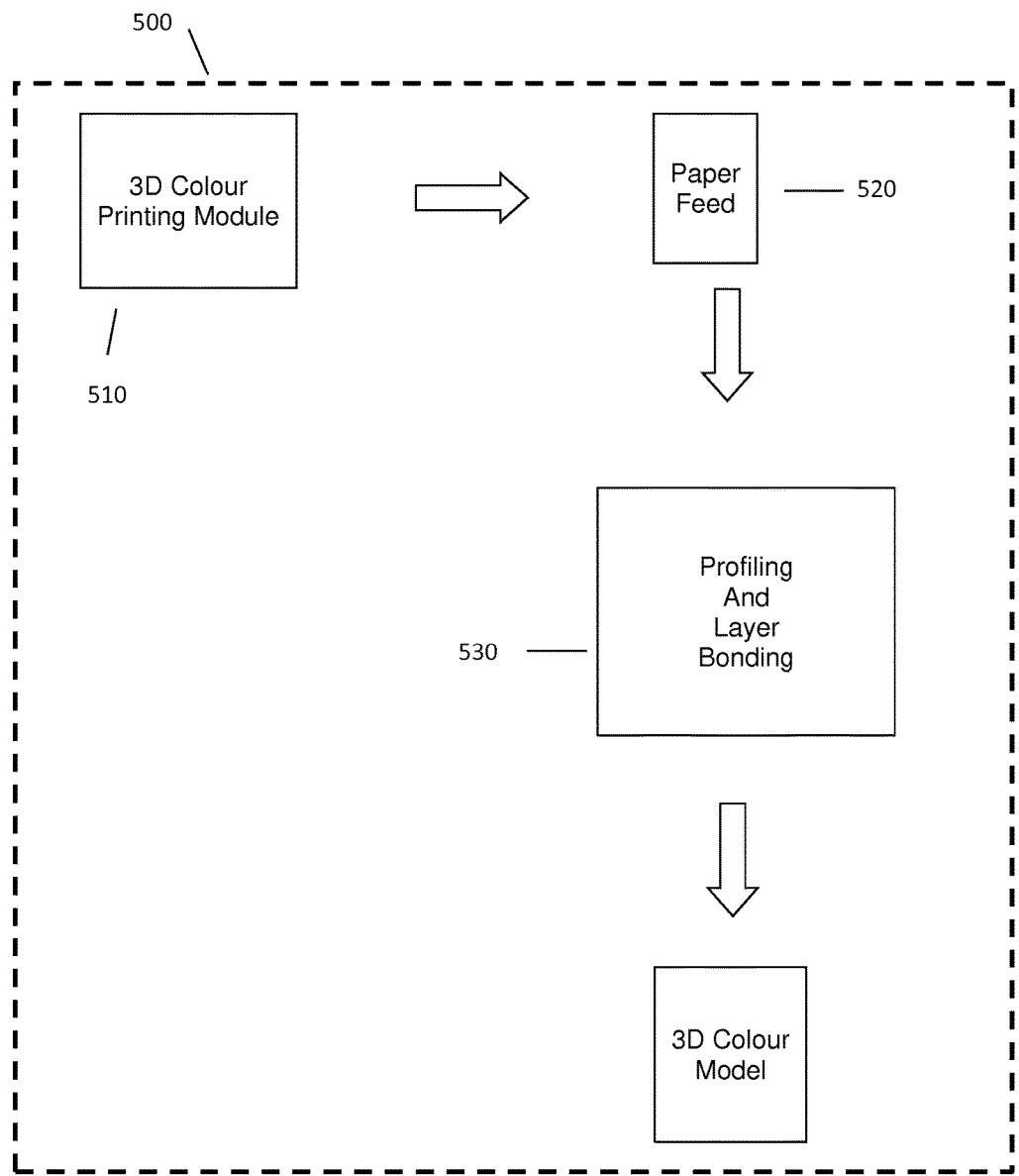
FIG. 2a is a block diagram of a Layer Object Manufacturing (LOM) system according to an embodiment of the present teaching.
Figure 2B:
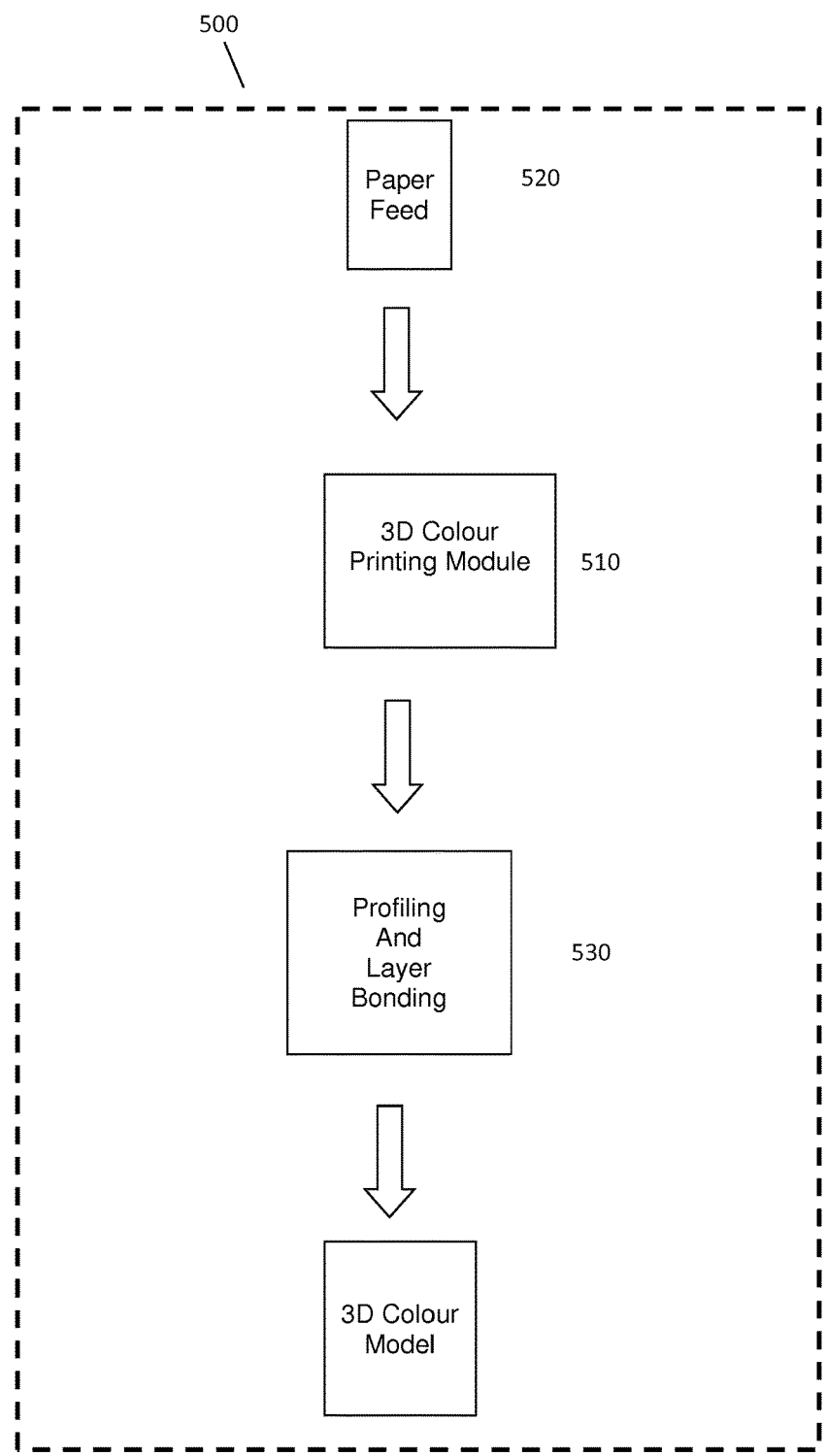
FIG. 2b is a block diagram of a Layer Object Manufacturing (LOM) system according to another embodiment of the present teaching.

FIG. 2a is a block diagram of a LOM system 500 according to one embodiment of the present teaching. Referring to FIG. 2a, the LOM system 500 may comprise a 3D colour printing module 510, a paper feed mechanism 520 and a profiling and layer bonding module 530. The layers in this embodiment are media layers and furthermore are a specific form of media, paper. Paper may be duplex printed in the 3D colour printing module 510 before being fed into the profiling and layer bonding module 530 via the paper feed mechanism 520 to produce the completed colour 3D object. In FIG. 2b, paper may be fed into the 3D colour printing module 510 via the paper feed mechanism 520, and then profiled and bonded in the profiling and layer bonding module 530 to produce the completed colour 3D object. The profiling and layer bonding module 530 may comprise separate profiling and layer bonding modules respectively.

Figure 2C:
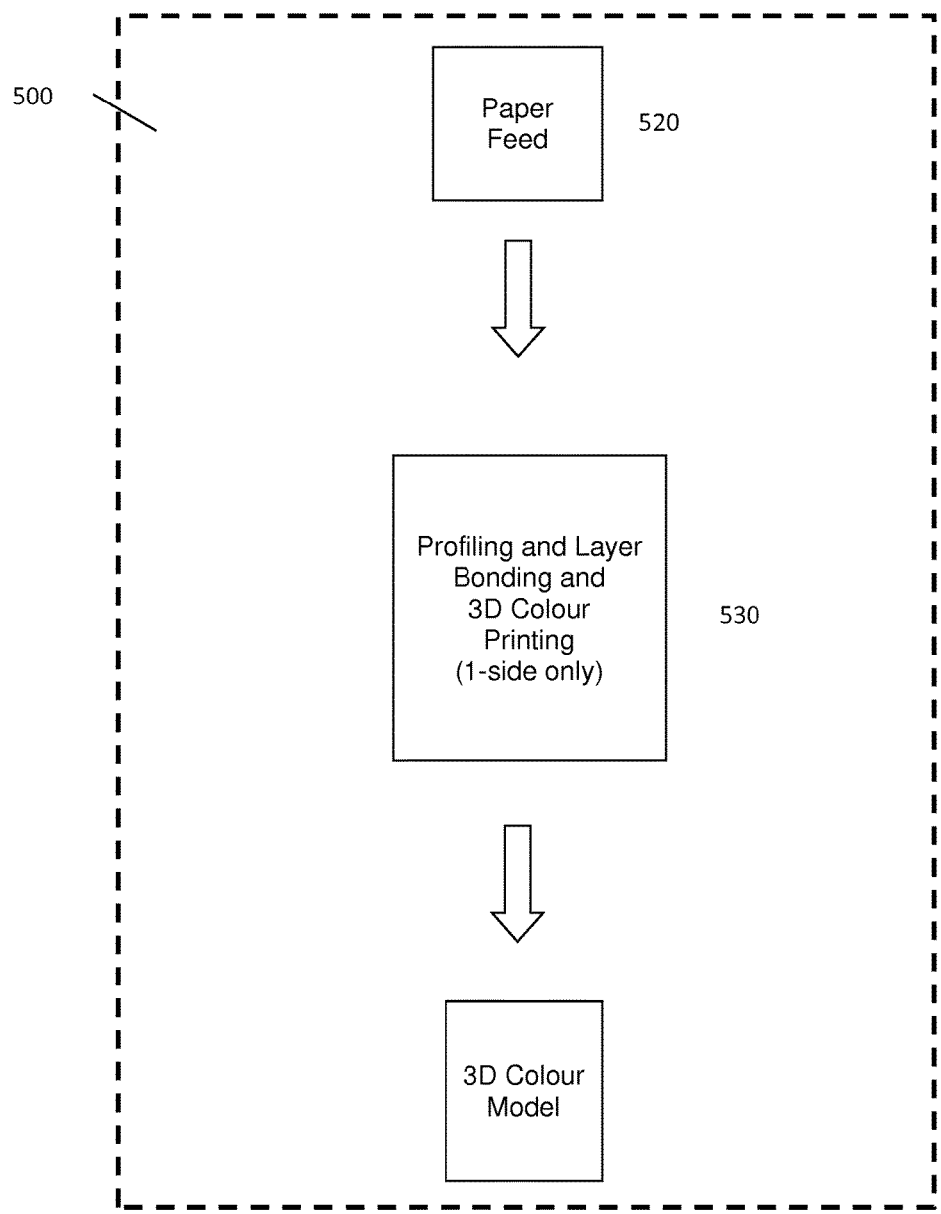
FIG. 2c is a block diagram of a Layer Object Manufacturing (LOM) system according to an embodiment of the present teaching.

In FIG. 2c, paper may be fed via a paper feed mechanism 520 into an integrated 3D colour printing, profiling and bonding module 540 which performs the printing, profiling and bonding processes, thereby producing a completed colour 3D object. In the embodiment of FIG. 2c, printing is performed on one side only of the media.

Figure 3:
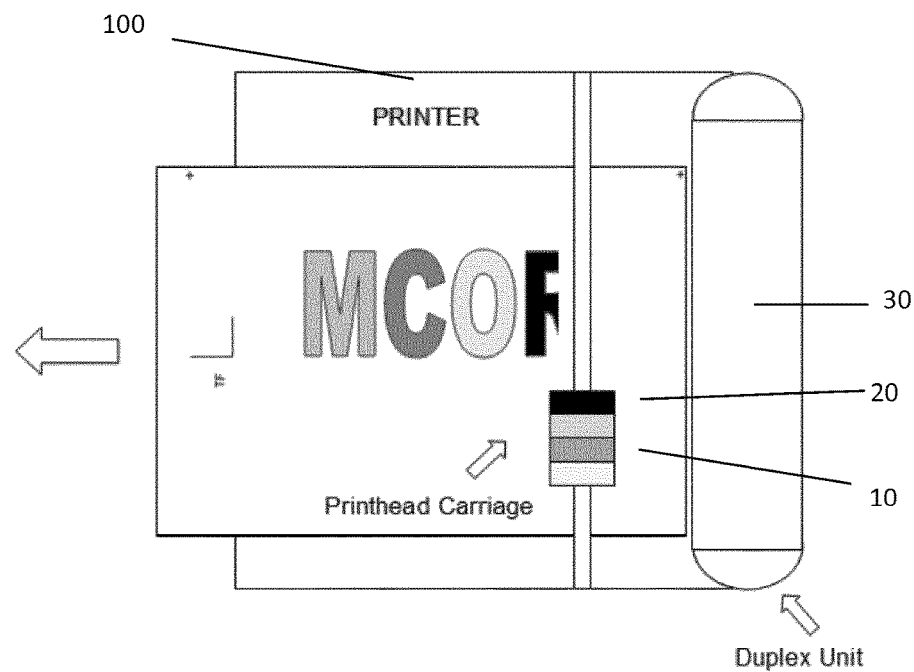
FIG. 3 illustrates a printing module printing a front side image of a 3D object media layer, according to an embodiment of the present teaching.

FIG. 3 illustrates a printing module 100 for printing a 3D object media layer, according to an embodiment of the present teaching. The printing module 100 may be configured to provide application of colour to both sides of the media layer. The colour delivered will therefore migrate from both sides as opposed to techniques where colour is applied from one side only. To provide this colouring of the media from both sides, a digital print file containing image, profile and colour information for the 3D object may be generated. This is then sent or otherwise loaded to the printing module 100. The digital print file may comprise a series of front-side-rear-side image pairs for each layer of the final stack. The colour part of the print file may comprise digital colour image information for both the front side and the rear side for all media layers to be printed. Each front-surface-rear-surface-front-surface image sequence may be aligned to one another in the digital file. The data set may also include physical front-surface-rear-surface alignment features which may be printed onto the media which allow both human and machine-readable alignment verification tests to be carried out to ensure front-back alignment is maintained during the course of the print run.

The printing module 100, which typically comprises a housing with specific areas, may be loaded with sufficient blank stock of media for the print task. As detailed above the media may comprise paper. The media rear, or trailing, edge and right-side edges may be accurately aligned in the paper tray to ensure that the media location during paper feed is reproduceable. FIG. 3 illustrates the printing of a front surface image using the printing module 100 according to an embodiment of the present teaching. Referring to FIG. 3, the printing module 100 may be configured for the printing of paper and may include a print head carriage 10, four colour heads 20, paper feed rollers and a paper feed mechanism (not shown), and a duplex unit 30 for inverting the media. Such a configuration and modifications thereto will be familiar to those of skill in the art of printers.

Figure 4:
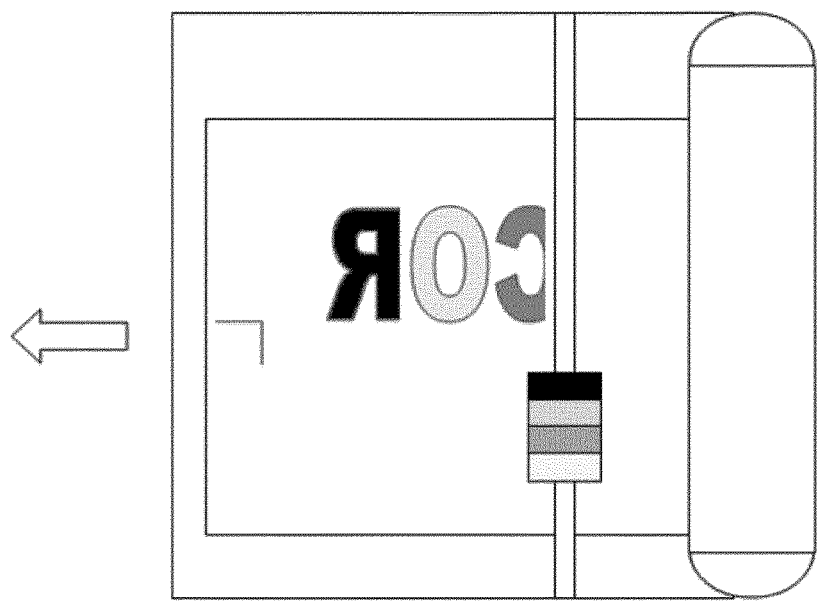
FIG. 4 illustrates the process of printing the rear side, that is, the mirror image of the front image.

The media stack may be printed layer by layer—or page by page of paper—, with first and second surfaces of each layer being colour printed, either simultaneouely or in sequence. The first and second surfaces of each layer may be opposite to each other. The first surface of the layer may be a front planar surface of the layer and the second surface of the layer may be a rear planar surface. The media may be driven into the printing module by the paper feed rollers and then curled back or otherwise transported towards the front of the printing module 100 by the paper feed mechanism. The media may then be presented to the reciprocating print head carriage, fixed page wide print bar that deposits one or more ink colours which may then print the front surface image. Once the front surface image is printed, the paper feed rollers may reverse and pull the media layer into the duplex unit 30 which causes the media to back-flip and present the rear surface to be printed to the colour heads 20. The image printed on the rear surface may be a mirror image of the front-surface image. FIG. 4 is a diagram illustrating the process of printing the rear surface image of an object media layer which has already had the front surface printed.

The preceding example discusses duplex (two-sided) printing using a single print head carriage that scans across the width of the media layer during printing, followed by the use of a duplex unit which inverts the media layer to allow printing on the underside of the media layer. Other configurations could also be employed. For example, a page-wide array print head may alternatively be used instead of a scanning print head carriage. In this arrangement it will be appreciated that the only moving mechanism is the media feed rollers. Another embodiment dispenses with a duplex unit and employs two scanning carriages or two page-wide array print heads printing simultaneously on both sides of the media layer respectively. The advantage of this method is that mechanical mis-registration errors between the top and bottom images are eliminated as the media feed mechanism is substantially simplified to a planar media feed path and the two print head movements may be interlocked through sharing the same displacement encoder system.

Figure 5:
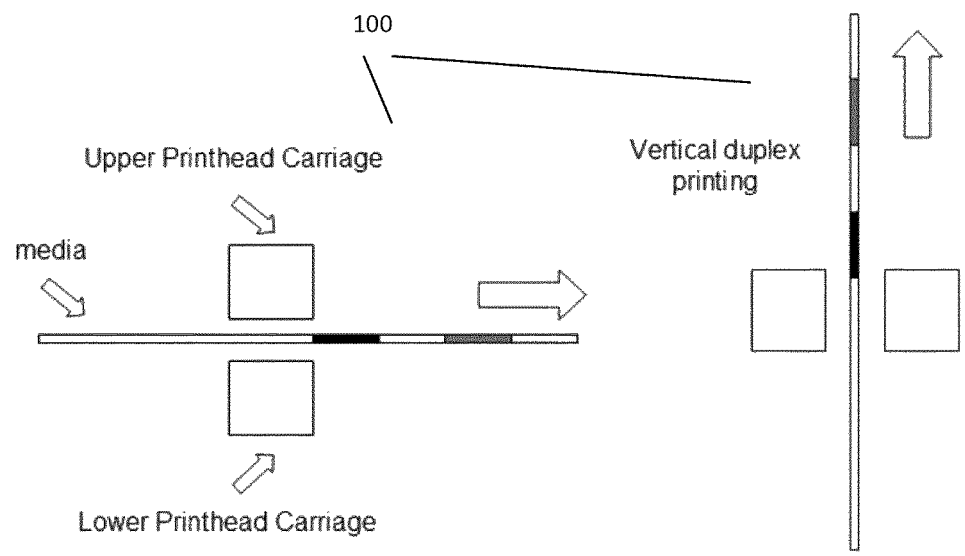
FIG. 5 illustrates horizontal and vertical simultaneous duplex printing with print head carriage pairs.
Figure 6:
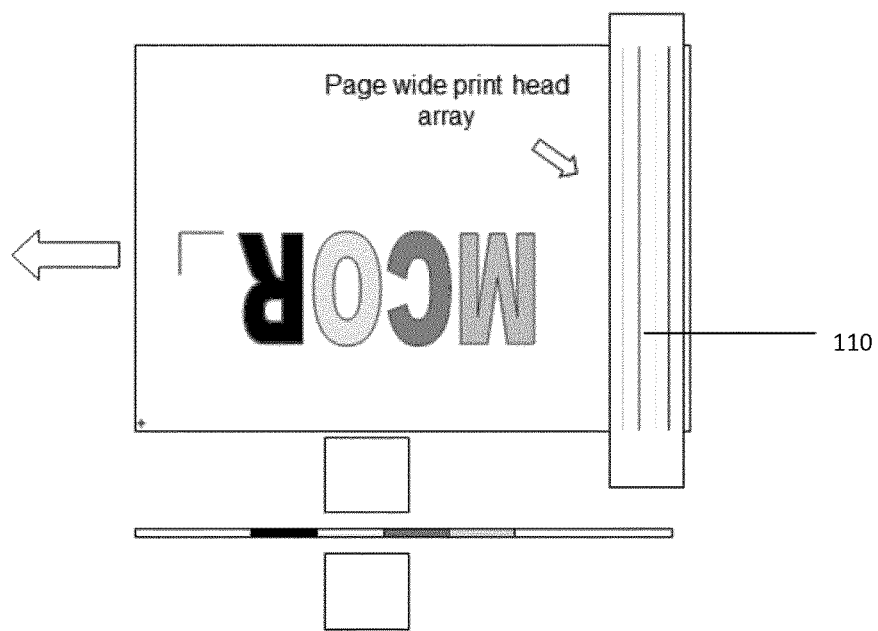
FIG. 6 illustrates horizontal and vertical simultaneous duplex printing with page-wide array print-heads.

The printing may be performed while the media object layer is disposed in a horizontal or vertical plane in the printing module as illustrated in FIG. 5. In this embodiment, upper and lower print head carriages are utilised at the first and second surfaces of the media layer, respectively. FIG. 6 illustrates a page-wide array print head 110 for horizontal or vertical simultaneous duplex printing. Also, the print head may be integrated into the profiling and layer bonding module, and operate between the paper feed and profiling and layer bonding processes, as a single stage process.

Test duplex prints may be printed and checked for alignment of the front and rear images by illuminating the rear of the media so that the rear image profile may be illuminated and superimposed on the front surface image. Alignment devices such as cross hairs may also be used on both sides of the object media layer to allow the operator to judge how much adjustment of the front and rear images needs to take place to ensure that both images are correctly aligned.

To enable accurate alignment of offset duplex printed media layers with one another on a layer-by-layer basis during the subsequent profiling and bonding of the media layer stack, a sensor on the profiling and bonding module 530 may read a printed fiducial on either the upper or lower surface of a printed media layer and use the fiducial's positional information to enable the module to move and locate the current media layer to be positionally coincident with the previously printed media layers.

Figure 7:
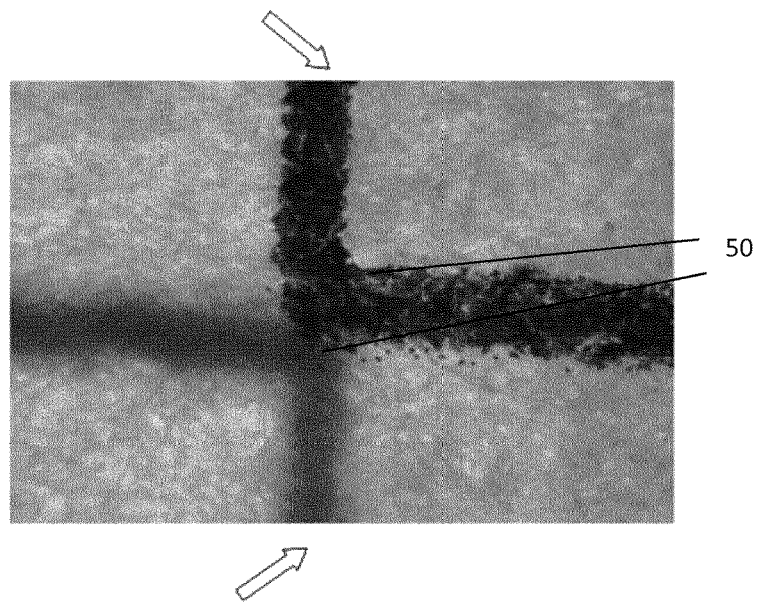
FIG. 7 is a photographic image of alignment devices used to align front and rear images.
Figure 8:
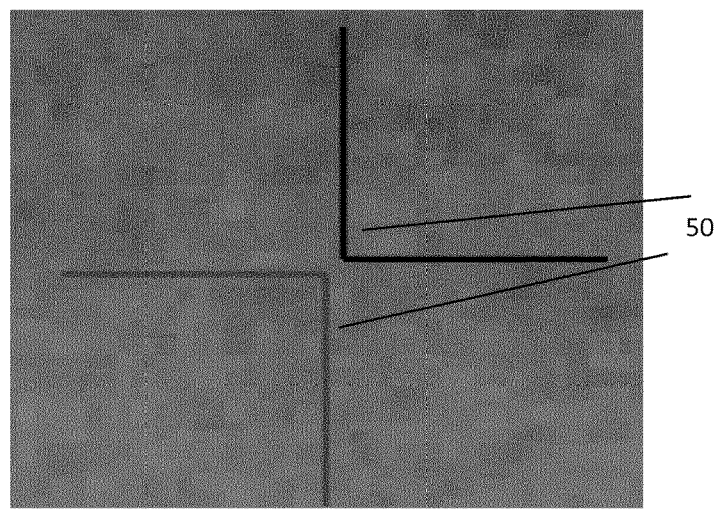
FIG. 8 illustrates a front-rear image alignment device.
Figure 9A:
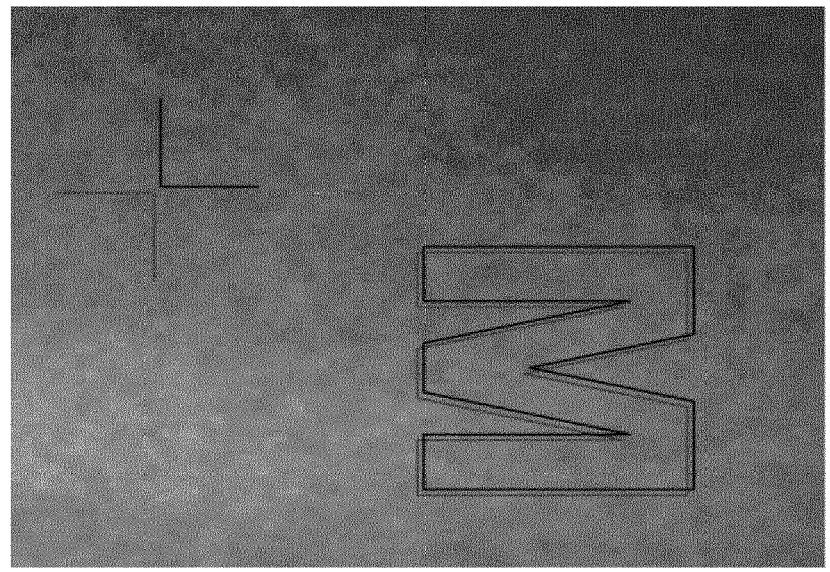
FIG. 9a illustrates an alignment device in the form of a letter "M" printed on both sides of a media layer and misaligned.
Figure 9B:
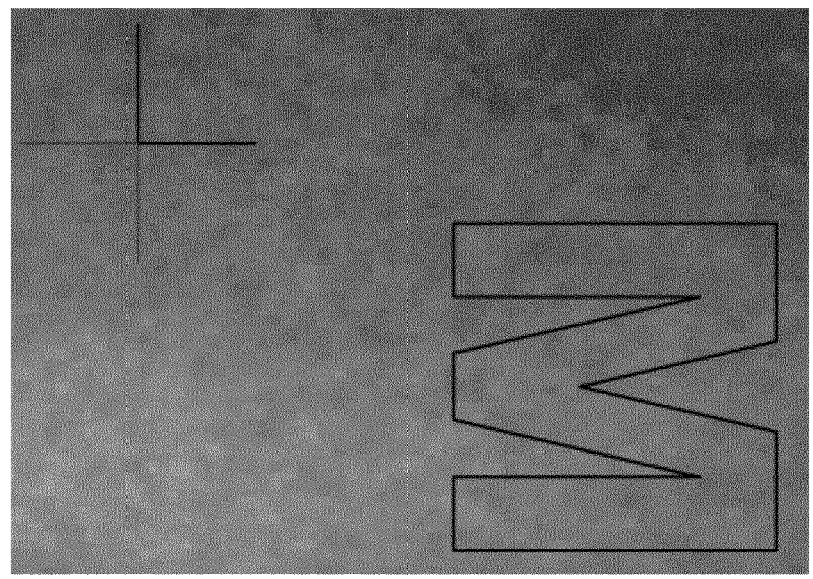
FIG. 9b illustrates an alignment device in the form of a letter "M" printed on both sides of a media layer and perfectly aligned.

FIG. 7 is a photographic image of an example of alignment devices 50 that may be used to align front and rear images. The alignment devices may be designed to align to form a cross-hair when the images on both sides are coincident and there is no misalignment. In FIG. 8 the upper right-hand quadrant is printed on the front of the media layer, and the bottom left quadrant is printed on the rear of the media layer. Referring to FIG. 8, the front image is positioned too much to the right, and higher than the rear image. Neither the vertical lines nor the horizontal lines in each of the devices 50 align correctly. As illustrated in FIG. 9a, the letter "M" has been printed on both sides of the media layer and is misaligned. When the alignment devices are in perfect alignment, the front image and the rear mirror image are superimposed perfectly, as illustrated in FIG. 9b.

The method described above comprises pre-printing colour on both sides of the 3D object media layer (offset printing). After a plurality of such layers are formed, the layers may be bonded together and profiled to complete the formation of the colour 3D printed object. The profiling process may comprise cutting the layers according to a predetermined pattern.

Figure 10:
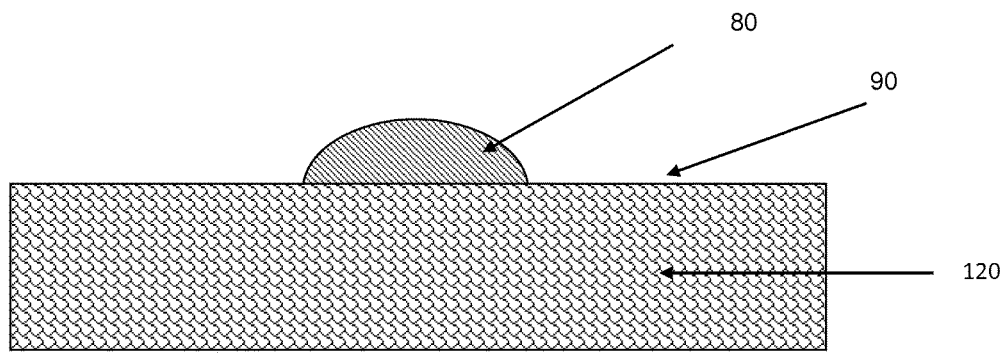
FIG. 10 illustrates ink deposited onto a media layer from the front side of a media layer, according to an embodiment of the present teaching.
Figure 11:
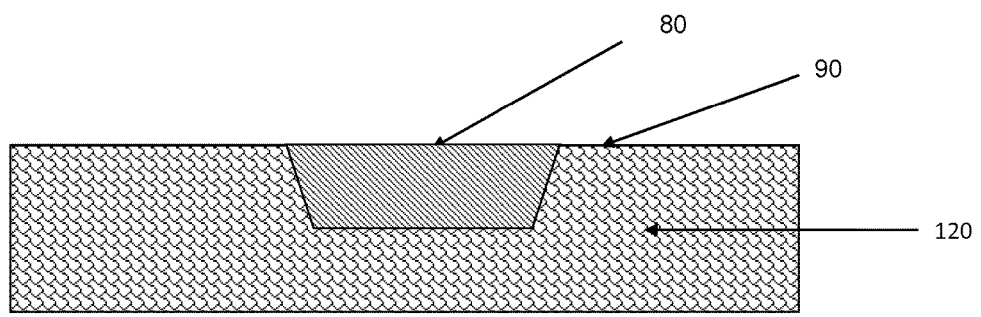
FIG. 11 illustrates how sufficient ink is deposited to penetrate approximately half way through the media layer, according to the present teaching.

According to a specific embodiment of the present teaching, printing takes place from both sides of the media layer with sufficient ink to penetrate approximately half way through the thickness of the media later on both sides respectively. FIG. 10 illustrates ink 80 being deposited onto a front surface 90 of a media layer 120. Sufficient ink 80 may be deposited to penetrate approximately half way through the media layer 120, as shown in FIG. 11. During printing, as soon as the ink makes contact with the media it begins to be absorbed by the media in three dimensions, in the plane of the media (in directions X and Y) and through the thickness of the media. As a consequence, the size of the printed dot pixel grows over time, from the initial surface contact dimensions. By printing on both sides of the media this spread in the dot size is reduced to a value approximately half of the spread in image, had one wanted to print through the entire media thickness layer from one side.

Figure 12:
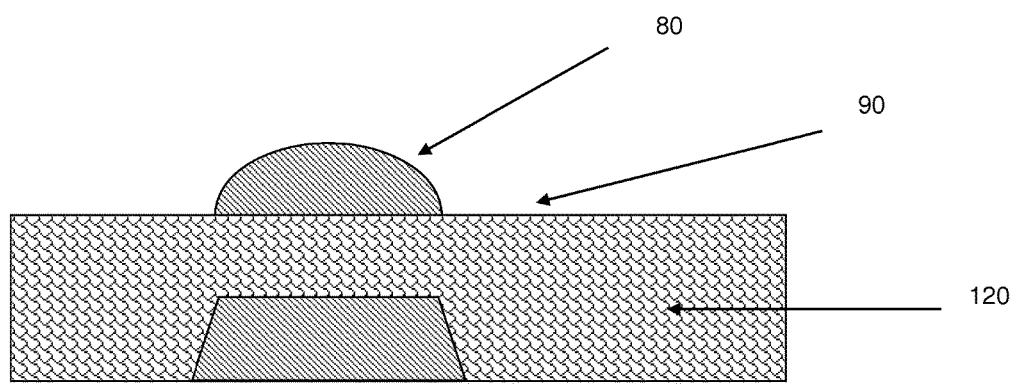
FIG. 12 illustrates ink deposited onto the media layer from the rear side at a coincident location to the front side image, according to an embodiment of the present teaching.
Figure 13:
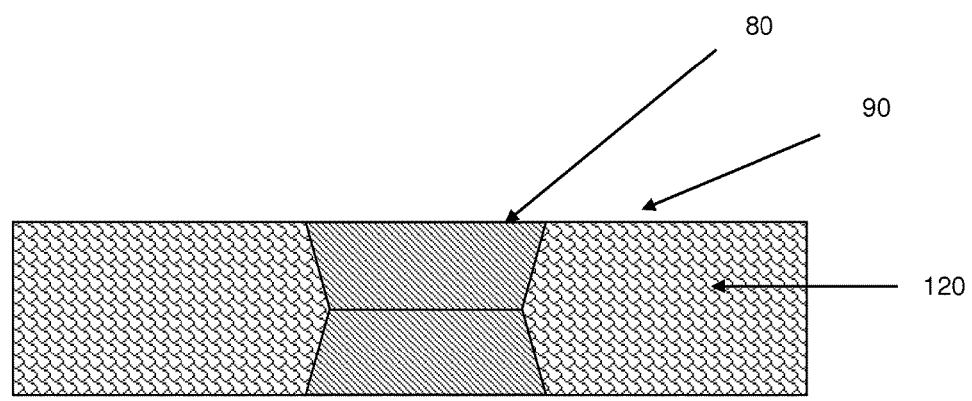
FIG. 13 illustrates how ink absorbed from the front and rear side images are combined.

Ink 80 may be similarly deposited on a rear surface 95 of the media layer 120, either simultaneously, using duplex printing, or after the media layer 120 is inverted using a duplex unit, as described above. This step is illustrated in FIG. 12. According to the present teaching, the front and rear images may be configured to be coincident and to create a print-through region 85. A print-through region, as illustrated in FIG. 13, means that the entire thickness of a region of the media layer 120 comprises ink.

Referring to FIG. 2b, after a stack of such media layers has been printed in the printing module 100, the stack may be transferred to the profiling and layer bonding module 530. As shown in FIG. 2c, it is possible to print on a stack of already assembled individual media layers. It is also possible, although not shown, to offset print duplex media layers individually and then immediately feed them into the profiling and bonding module 530.

Figure 14:
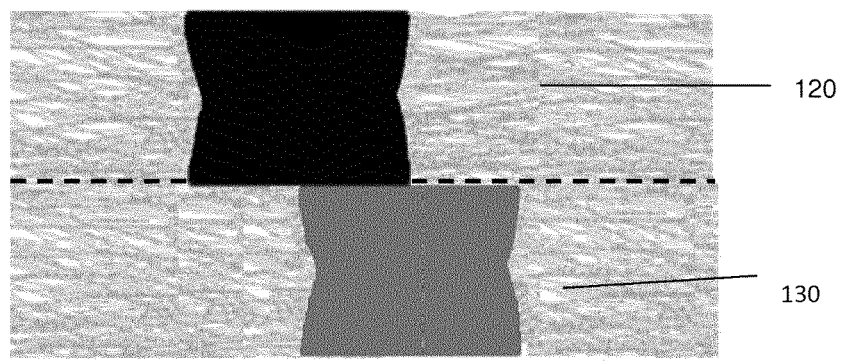
FIG. 14 illustrates two pre-printed layers after a bonding process, according to the present teaching.
Figure 15:
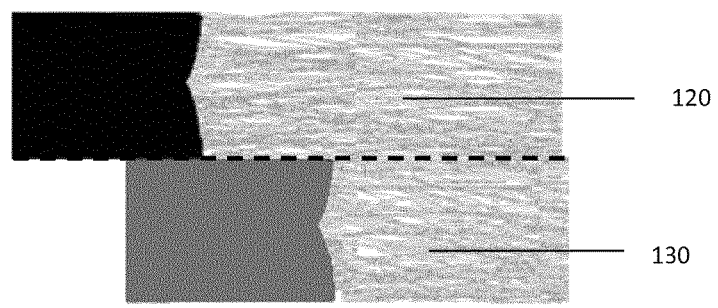
FIG. 15 illustrates an edge and colour profile of the combined layers after bonding and weeding showing removal of unwanted media.

The first layer may be placed on the profiling and layer bonding module 530, and that layer may be profile cut with a computer-controlled blade. This cut may provide precise colour edge definition compared to the ragged, liquid-flow edge achieved using inkjet printing alone. Then the next layer may be positioned and bonded on top of the previous layer and then profile cut. The process is continued until all pre-printed layers have been bonded and profile cut in the profiling and layer bonding module 530. FIG. 14 illustrates two-pre-printed layers 120 and 130 after bonding, and FIG. 15 illustrates the edge and colour profile of the two layers 120 and 130 after bonding and profiling or weeding. The profiling, or weeding, process comprises removal of unwanted portions of the media layers.

The colour 3D printing process described above provides several advantages. When a media layer is printed from both sides simultaneously, less image spread occurs, thus providing better image feature dimensional control. No colour interaction between printed layers occurs, which preserves the fidelity of the desired image. Offset printing enables printing by an entity, for example the printing module described above, remote from the location where profiling and lamination of layers takes place. This offers a number of advantages such as prototyping and adjusting colour before 3D layer assembly, as will be described below, as well as allowing the profiling and layer bonding module 530 to be fully utilized in profiling and bonding.

The present teaching also provides a 3D object gamut mapping method that analyses the orientation of the surface to be printed in order to adaptively print colour of an intensity to normalize the overall intensity of all surfaces. As mentioned above, each layer of the 3D object may be printed in colour on one or both sides at a coincident location so that a print-through region is formed. There are three facets to each layer, the horizontal front side (face up), the horizontal rear side (facing down) and the profiled (cut) vertical walls.

It will be appreciated that each surface of the finished 3D object may have varying percentages of front/back/vertical surface area exposed to light.

In order to compensate for this, the method according to the present embodiment comprises analysing the orientation of a surface of the layer to be printed in order to adaptively modify the colour printed to that layer. The method may be configured such that on assembly of the plurality of layers, the overall intensity of all surfaces of the 3D object is normalized. This process implies a further gamut-mapping which comprises an additional dimension; i.e. angle relative to the layering direction. As gamut mapping is typically already a 3-dimensional transform, the new operation is maximally 4-dimensional: tri-stimulus (e.g. RGB)+angle.

Figure 19:
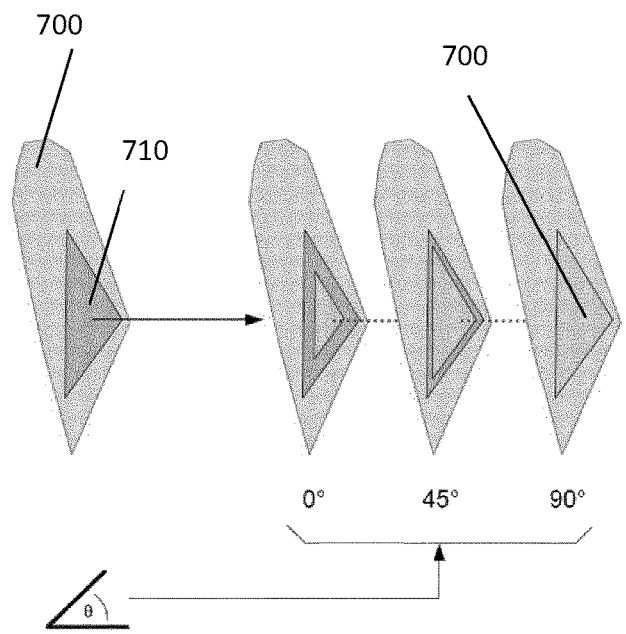
FIG. 19 illustrates a visual representation of an example of the 4D transform used n the 3D object gamut mapping method according to the present teaching.

A visual representation of example of the 4D transform is shown in FIG. 19. A graphic of the XY chromaticity diagram, denoted by reference numeral 700 is used to represent the input and output gamuts; this is already a 2D visualisation of a 3D space which makes this illustration possible. A triangle 710 is a representation of the original 2D printer gamut, while a triangle 720 is the angle-dependent mapped output gamut. Three discrete output gamut graphics are shown at 0°, 45°, and 90°, although it will be understood by those skilled in the art that there may be a continuity of output gamut values across the range of potential input angles.

Taking a value of the input colour space and mapping to a 0° facet, for example, may mean a desaturated version of this value may be printed, thus implying a smaller output gamut; mapping on to a 90° facet, on the other hand, may mean that a fully saturated colour may be printed on the paper but this may then be de-saturated by the profiling described above. Both outputs may then present the same visual effect to the viewer.

The method may comprise defining a 3D object formed from a plurality of surfaces, identifying within the 3D object individual ones of the plurality of surfaces, and for selected ones of the plurality of surfaces, normalising the overall colour intensity of all surfaces of the 3D object. The method may be applied in a printing module for forming a colour 3D object formed from a plurality of layers, and may comprise analysing the orientation of a surface of each layer to be printed in order to adaptively modify the colour printed to that layer. The method may be configured, such that on assembly of the plurality of layers, the overall intensity of all surfaces of the 3D object is normalized.

The method may comprise determining an ink to be used on each of the plurality of layers. The method may also comprise determining a media type for each of the plurality of layers. Thus, a media and ink set may be determined for each of the plurality of layers. A mapping function may then be determined empirically for each ink and/or media type employed according to at least one calibration 3D object. The at least one calibration 3D object may comprise a number of 3D test pieces.

The mapping functions may be determined empirically for each ink and/or media employed by measuring a number of 3D test pieces with varying wall angles using a colorimeter and plotting colour intensity versus wall angle for a range of wall angles between 0° and 90°. Such a technique is advantageous in a number of different applications. For example, if the raw colour intensity of a vertical surface is measured at 80% of that of a horizontal surface due to the de-saturation described above, the mapping process may reduce the intensity of the horizontal surface by 20% in order to produce uniform colour intensity for an orthogonal 3D shape.

As with conventional 2D gamut mapping, the mapping functions may have differing degrees of complexity which may be learned from the measured data—this may define how the function may be implemented in software.

The actual transformation may be described as a function of input colour space coordinates and facet angle for each output colour coordinate; this is represented in Equations 1-3 below where X values represent dimensions of the input colour space and Y values the output space:

$$Y_1 = f_1(X_1, X_2, X_3, \theta) \qquad \text{Eq. 1}$$

$$Y_2 = f_2(X_1, X_2, X_3, \theta) \qquad \text{Eq. 2}$$

$$Y_3 = f_3(X_1, X_2, X_3, \theta) \qquad \text{Eq. 3}$$

For a specific example using an RGB colour space for both input and output and facet angle $\theta$, then the functions for generating red output would translate to those given in Equations 4-6.

$$R_o = f_r(R_i, G_i, B_i, \theta) \qquad \text{Eq. 4}$$

$$G_o = f_g(R_i, G_i, B_i, \theta) \qquad \text{Eq. 5}$$

$$B_o = f_b(R_i, G_i, B_i, \theta) \qquad \text{Eq. 6}$$

The actual functions employed will be specific to the manufacturing technology being examined and how this alters colour with angular variation. Going from least to most complex, any of the following methods may be employed, although it will be appreciated that the present teaching should not be construed as being limited to these exemplary arrangements:

1. Linear relation: this is simply where all measured values fall on a straight line and are gained by applying a scaling coefficient to the raw data value dependent on angle. A fixed 4-dimensional scaling may be applied to the input coordinates which may be described by Equations 7-9. The values [a . . . p] are constants derived from colour calibration.

$$Y_1 = aX_1 + bX_2 + cX_3 + d\theta + e \qquad \text{Eq. 7}$$

$$Y_2 = fX_1 + gX_2 + hX_3 + i\theta + j \qquad \text{Eq. 8}$$

$$Y_3 = kX_1 + mX_2 + nX_3 + o\theta + p \qquad \text{Eq. 9}$$

2. Polynomial: If the relationship is more complex such that it cannot be described by a linear transformation but is still represented by a continuous function, a polynomial transformation may be employed. For the sake of brevity only one colour output, $Y_1$, is given in Eq. 10 which describes a third order polynomial. The chosen polynomial function may be applied to the raw data to obtain the mapped value. The values [a . . . n] are again constants derived from colour calibration but are unrelated to those of Equations 7-9.

$$Y_1 = aX_1 + bX_1^2 + cX_1^3 + dX_2 + eX_2^2 + fX_2^3 + gX_3 + hX_3^2 + iX_3^3 + j\theta + k\theta^2 + m\theta^3 + n \qquad \text{Eq. 10}$$

It must be noted that the linear transformation is simply a first-order realisation of the polynomial approach. It is clear that for higher-order polynomials this may become unwieldy.

3. Irregular: In this case the function may not be smooth or may have a large number of inflection points. A polynomial approximation may be too complex, so a look-up-table (LUT) may have to be used. This may also require more measurement data to completely define the table. In this case each 4-tuple in $[X_1, X_2, X_3, \theta]$ will be directly mapped to a distinct stored output value for each of $[Y_1, Y_2, Y_3]$. These values may be derived from calibration and stored in computer memory. A dimensionality factor may come in to play here if, for example, each of the values $[X_1, X_2, X_3, \theta]$ as well as the output coordinates is comprised of 8 bits, the resulting LUT may need to be ~4.3 MB in size for each of the 3 outputs. In practise, it may also be impossible to collect this amount of data in a calibration stage, so a more realistic approach may be to gather a sufficient number of data-points for the LUT to provide acceptable error-margins, and then interpolate between these in 4-dimensions to produce the desired value. The interpolation scheme may be linear, spline, or any other desired method.

Returning to the example of colour printing on white paper in a LOM apparatus, the background colour may be near-white or approximately colour neutral. In this case it may be possible to implement a much simpler transformation method which only modifies the saturation value. For a colour space such as RGB, this does not provide much advantage as saturation adjustment requires modification to all three colour values; i.e. reduce all of R, G, and B for a reduction in colour saturation. There are colour-spaces, however, which employ saturation as one of the coordinates, for example HSV (hue-saturation-value), and HSL (hue-saturation-luminance). If one of these spaces is used then the transform becomes a 2-dimensional function. For the case of HSV, for example, the H and V values are simply copied from the input to output image and only the S is transformed as described in Equation 11.

$$S_o = g(S_i, \theta) \qquad \text{Eq. 11}$$

The function, g, employed here may again be implemented as a polynomial, LUT, etc. as described above, but with the advantage of only a single transformation and lower dimensionality.

Figure 20:
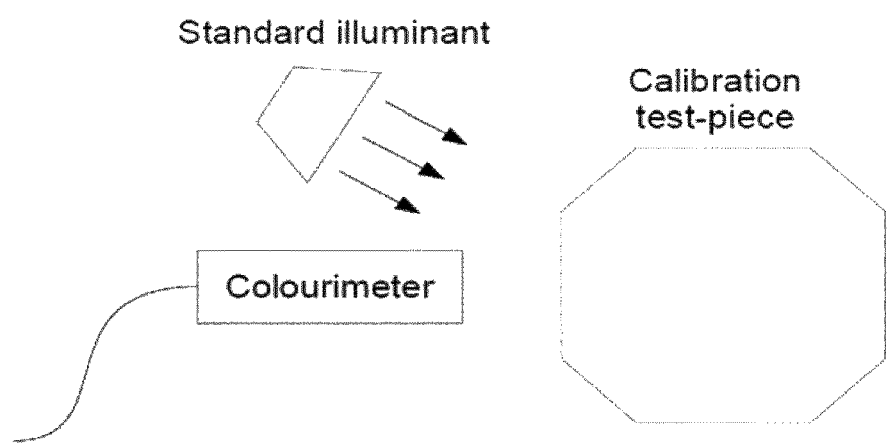
FIG. 20 illustrates a basic example of an octagonal test part used in a calibration step in the 3D object gamut mapping method according to the present teaching.
Figure 21:
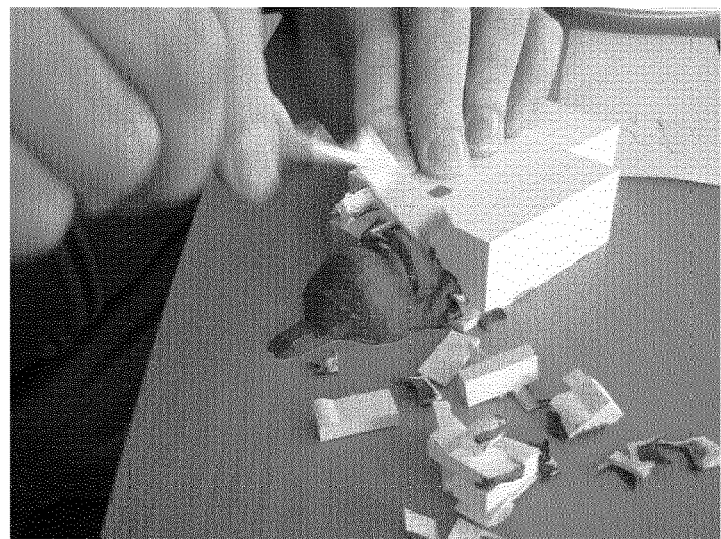
FIG. 21 is a photographic image of a colour 3D object during the weeding process.
Figure 22:
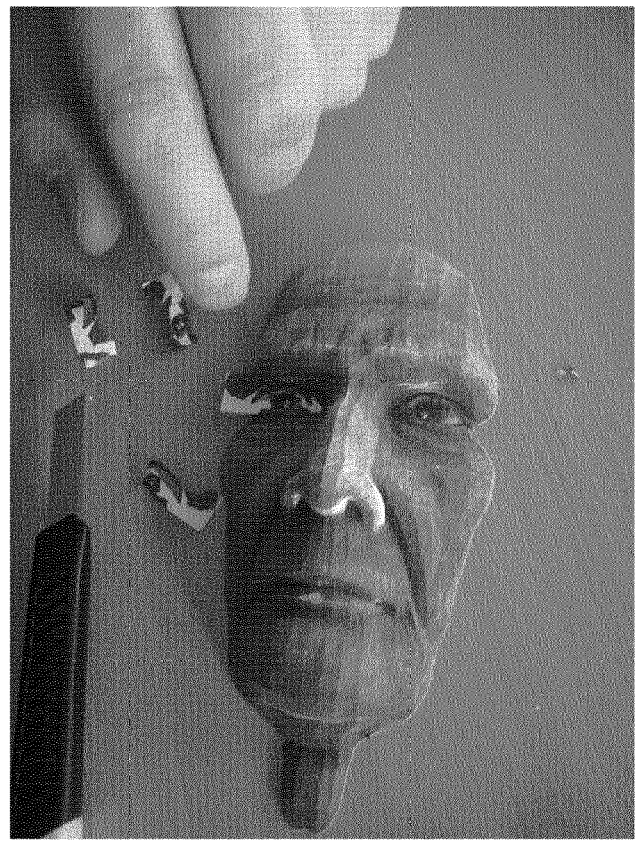
FIG. 22 is a photographic image of a colour 3D object after weeding.

In order to characterise the 3D gamut-mapping function, as mentioned above, a calibration step is required of the 3D manufacturing process being used. In this process, a series of sample colours may be printed on test parts with facets of varying angles. No colour-modification may be used on these parts such that the effect of different angles on different colours may be measured. A colour measurement device may then be employed to read the results from each of the facets. The colour measurement device may be a colorimeter used in conjunction with an illuminant (e.g. D65), or even a simple flatbed-scanner for lower accuracy results. A basic example of an octagonal test-part is shown in FIG. 20 which may provide colour values for 0°, 45°, and 90°, although many more data-points may be required.

After sufficient calibration data has been gathered, some initial analysis may be required in order to select the mapping function. If only saturation is modified, for example, the simple 2-dimensional transform described above may be used. Also the mapping function may be selected by examining the data and possibly curve-fitting to a polynomial; alternatively, the raw-data may be inserted into a LUT which may later be interpolated for specific values. The required accuracy of the colour may also be an application-dependent selection factor in the choice of mapping function.

The example application which has already been detailed is that of paper-based LOM type manufacturing, where the profiling of the physical medium alters the visual effect of the colour. The 3D gamut mapping process may, however, be applied to a generality of methods for colouring 3D manufactured objects, where a dependency exists between the angle of a surface and the applied colour. Another example may be that of spraying or jet-printing onto different angled surfaces of a finished object. Due to the fact that the ink or paint droplets may be affected by gravity, spraying upwards onto a bottom surface may result in lower ink volume than spraying downward onto a top surface, for example. In this case gamut-mapping may also be applied to normalise the effect.

In one configuration provided in accordance with the present teaching, the 3D object gamut mapping method may be performed by a 3D object gamut mapping engine integrated in the printing module according to the present teaching. As mentioned above, the 3D object gamut mapping engine may be implemented using a software solution. A computer software program that is executed on a computer or computer network may perform the 3D object gamut mapping method described above. The program may be stored on a suitable computer-readable medium in the computer. The 3D object gamut mapping engine may be configured to interface with a profiling module to operably identify individual edge surfaces of the 3D object, and to selectively effect an application of colour to those edge surfaces. The profiling module is configured to effect a profiling of individual ones of the plurality of media layers to effect a desired 3D shape within the 3D object.

The computer-readable medium may be a removable storage device or a non-removable storage device, for example, memory cards, magnetic disk drives, magnetic tape drives, and optical drives for memory storage and retrieval on magnetic and optical media. Storage media may include volatile and nonvolatile media, both removable and non-removable, and may be provided in any of a number of configurations, for example, RAM, ROM, EEPROM, flash memory, CD-ROM, DVD, or other optical storage medium, magnetic cassettes, magnetic tape, magnetic disk, or other magnetic storage device, or any other memory technology or medium that can be used to store data and can be accessed by a processing unit. The 3D object gamut mapping method described above may be stored on the storage device using any method or technology for storage of data, for example, computer readable instructions, data structures, and program modules. The storage device may be part of the printing module or LOM system described above.

The present teaching also provides media, for example paper, and ink for that is optimised for 3D colour printing. According to an embodiment of the present teaching, media for 3D colour printing may be designed with a reduced concentration of sizing agent in the body of the media, and a reduced concentration of sizing agent on the two surfaces of the media.

In addition, the media may be treated during manufacturing, or post-manufacturing with a solution of a non-ionic surfactant such as ethoxylated 2,4,7,9-tetramethyl-5-decyne-4,7-diol, an ethoxylated acetylenic diol making up between 0.1% and 1.0% concentration in water as a post processing surface spray.

When the media is constructed in the manner, and printed with water-based and dye colourant inkjet ink (or a mixture of water and ethanol based in), the ink fluid may be rapidly adsorbed by the media and may permeate through the thickness of the media rapidly.

In terms of the ink used in colour 3D printing, the present teaching provides an ink that is designed to be receptive and readily adsorbed by the media throughout the media's thickness. This is achieved by the addition of surfactants that may reduce the surface tension of the ink further, ensuring that the ink is able to penetrate most cellulose media types. This is counter-intuitive to conventional desktop inkjet printing, where it is desirable to retain substantially a colour penetration of the media surface only, leaving the body of the media free of ink. The ink composition may include a non-ionic surfactant such as ethoxylated 2,4,7,9-tetramethyl-5-decyne-4,7-diol, an ethoxylated acetylenic diol making up between 0.1% and 1.0% concentration of the ink. The balance of the ink composition may include water (75%-85%), water soluble dyes (up to 5%), humectants such as glycerides (up to 5%), anti-bacterials agents, and alcohols (up to 8%). Conventional 2D inkjet ink has a surface tension of 34-38 dynes/cm; however in accordance with the present teaching, for 3D printing it is desirable to reduce the surface tension of the ink to below 30 dynes/cm. The addition of 1% of an ethoxylated acetylenic diol has been shown by the present inventors to reduce the surface tension of the ink to a value of approximately 26 dynes/cm, rendering the ink to be rapidly absorbed by the paper.

During the 3D offset colour printing process, additional information may be printed into the margins of each layer to provide error correction and build instructions. Each printed layer may include a sequence code that may be read by the profiling module, and verifies that the layer to be profiled is in the correct sequence. Each printed layer may include a code that informs the profiling module what media type is in the sequence. Media refers to the substrate that is being used in the 3D fabrication process may be cellulose paper. However other media types may also be employed, and may include, polymer film, metal foils, ceramic powder impregnated paper sheets, metal powder impregnated sheets, polymer powder impregnated sheets, water soluble papers, and substrates made from waxes. The code may inform the profiler that a particular layer requires a different profiling recipe (for example, slower cut, or deeper cut due to a thicker or difficult to cut media type). The code may inform the profiler that, for example, the next three layers have an identical profile, and to perform a multiple layer cut. The media may also include media alignment marks which inform the profiler how to align each media layer relative to the profiler table.

According to the present teaching, there may be two zones of material in a printed 3D object build:
  a) the bond zone—media layers in this zone may be strongly bonded together. The finished object may be constructed of these layers.
  b) the tack zone—media layers in this zone may be temporary, support layers. These layers may be weakly bonded together (tacked) so that they may easily separate during the weeding process when unwanted support material is removed from the printed media stack to reveal the 3D printed object.

Figure 16:
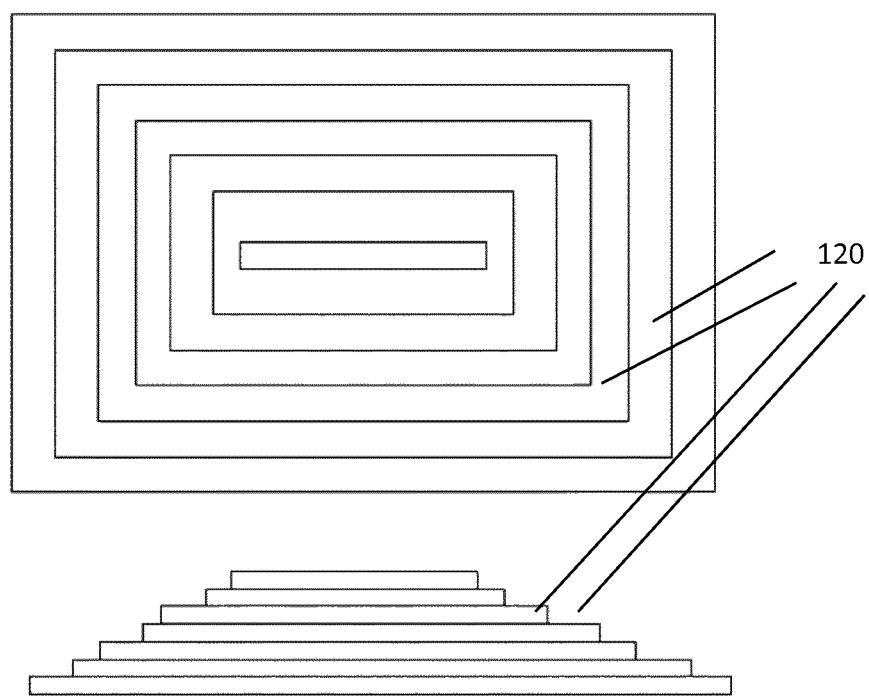
FIG. 16 illustrates a plan and cross-sectional view of a 3D object to be formed after weeding.

The material in the tack zone may be colour coded for a number of layers approaching the bond zone. Such colour coding might be a red cross-hatched area, which directs the weeding technician to proceed with caution during weeding as permanently bonded layers lie beneath the coloured cross-hatched area. FIG. 16 illustrates a plan and cross-sectional view of a 3D object to be formed after weeding.

Figure 17:
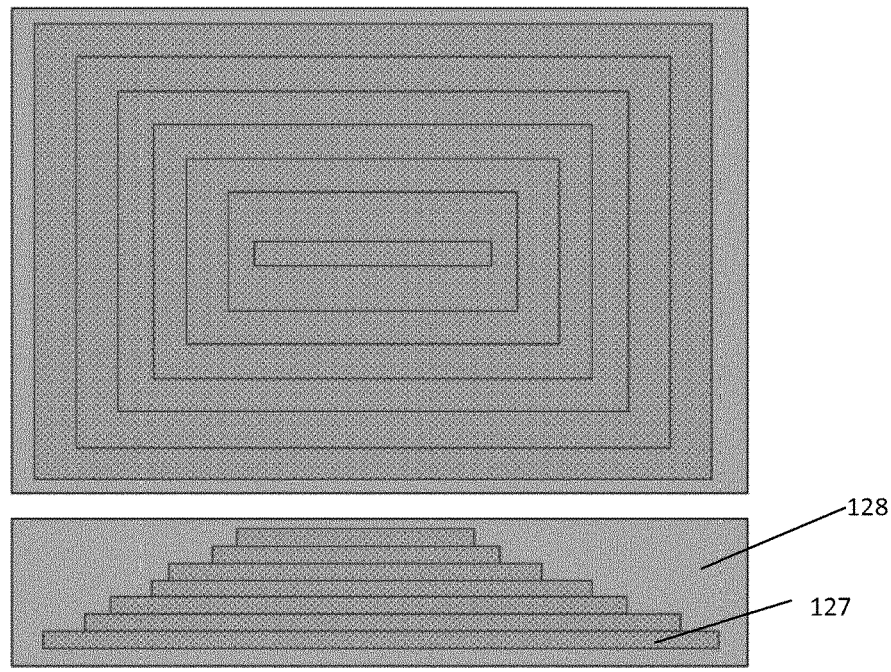
FIG. 17 illustrates a plan and cross-sectional view of a 3D object after being printed and before weeding.

The 3D object may comprise a plurality of colour 3D media layers 120. FIG. 17 illustrates a plan and cross-sectional view of a 3D object after being printed and before weeding. The 3D object may comprise a plurality of media object layers, each comprising a bond zone 127 and a tack zone 128. A number of the layers in the tack zone may be printed with a cross-hatched pattern. During the 3D printing process, the tack zone may be co-printed with the 3D printed object so that a number of tack layers above the bonded layers of the 3D object may be printed with a cross-hatched pattern to indicate that the solid object is close by. After printing, the 3D object and the tacked waste material, (containing layers of cross-hatched material) may coexist in one complete block of tacked and bonded media layers.

Figure 18:
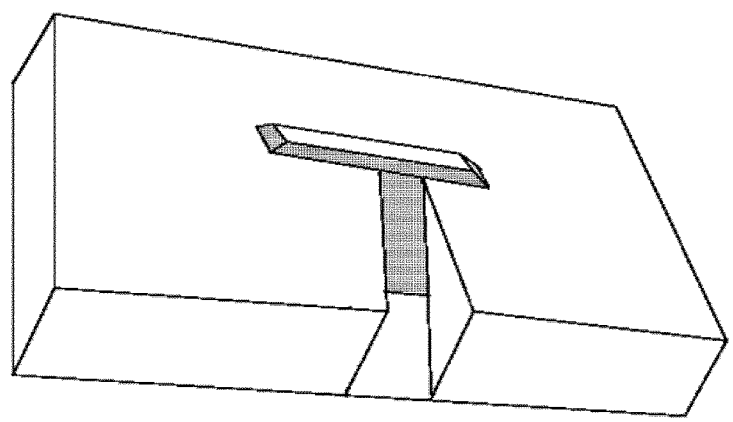
FIG. 18 illustrates a partially weeded object showing colour hatching.

During weeding, the unmarked tack layers may be peeled away. When a coloured cross-hatched region is reached, the weeding technician may proceed with caution, until the solid object is reached. FIG. 18 shows a solid 3D printed pyramid structure being revealed as tacked materials are removed. The cross hatched regions are represented in FIG. 18 by the darker shaded zones. These regions may be carefully removed. Colour codes and/or other marks may be used to indicate proximity to the build object. FIG. 19 is a photographic image of an example of a colour 3D object during the weeding process, and FIG. 20 is a photographic image of the completed colour 3D object after weeding has been performed. It is clear that by delimiting the intended 3D object from the off cut regions through a colouring process it is possible to ensure that the final 3D object is not damaged during the removal of the tacked material.

It will be understood by the skilled person in the art that the colour printing process described above may be performed in a separate module to the profiling and layer bonding module. However, the printing module may alternatively be integrated into the profiling and layer bonding module, whereby the colour printing process may be performed first, followed by bonding and profiling. In this embodiment the printing process is not 'offset' but rather integrated into the assembly process. The present teaching further provides a LOM system including the printing module and a separate profiling and layer bonding module for cutting the individual 3D object media layers and bonding the individual layers together to form the finished 3D object. In this case the colour printing is "offset" with respect to the bonding and profiling. Also, it will be understood that the ink according to the present teaching may be used in the printing module. Further, as described above, the 3D object gamut mapping method may be performed in the printing module or the LOM system according to the present teaching.

The words comprises/comprising when used in this specification are to specify the presence of stated features, integers, steps or components but does not preclude the presence or addition of one or more other features, integers, steps, components or groups thereof.

While the present invention has been described with reference to some exemplary arrangements it will be understood that it is not intended to limit the teaching of the present invention to such arrangements as modifications can be made without departing from the spirit and scope of the present invention. In this way it will be understood that the invention is to be limited only insofar as is deemed necessary in the light of the appended claims.

The invention claimed is:

1. A Layered Object Manufacturing, LOM, system configured to form a coloured three-dimensional (3D) object, the system comprising:
  a. a 3D object gamut mapping module configured to define a 3D object formed from a plurality of surfaces and provide a printing regime consistent with the defined 3D object, wherein the 3D object gamut mapping module is configured to analyse the orientation of a surface of each of a plurality of media layers of a finished 3D object to be printed and identify where a dependency exists between the angle of a surface of the defined 3D object and the colour to be applied to that surface in order to adaptively modify the intensity of a colour printed to that layer to normalize the overall colour intensity of all surfaces of the 3D object where a dependency exists between the angle of a surface of the defined 3D object and the colour to be applied to that surface; and b. a printer configured to colour print at least a portion of a first surface of each of the plurality of layers in accordance with the printing regime.

2. The system of claim 1 wherein the system further comprises a collator configured to assemble the plurality of individual media layers to form the 3D object.

3. The system of claim 2, wherein the printer and collator are configured such that the printer effects printing of an individual media layer prior to a collation of that layer with a previously printed layer.

4. The system of claim 2, wherein the printer is configured to apply the colour prior to collation.

5. The system of claim 2, wherein the printer is configured to apply the colour during the collation.

6. The system of claim 2, wherein the collator comprises a bonding module configured to bond individual ones of the plurality of media layers.

7. The system of claim 6, wherein the bonding module is configured to use a water-based adhesive.

8. The system of claim 1, wherein the printer is configured to print a second surface of each of the media layers.

9. The system of claim 8, wherein the printing on first and second surfaces operably reduces image bleed and preserves colour accuracy regardless of angle of the object's surface.

10. The system of claim 1, wherein the printer is configured to apply multiple colours to at least a portion of the first surface of each of the plurality of layers.

11. The system of claim 1 comprising a profiling module configured to effect a profiling of individual ones of the plurality of media layers to effect a desired 3D shape within the 3D object.

12. The system of claim 11, wherein the 3D object gamut mapping module is configured to interface with the profiling module to operably identify individual edge surfaces of the 3D object, and to selectively effect an application of colour to those edge surfaces.

13. The system of claim 1 wherein the 3D object gamut mapping module is configured to identify within the 3D object individual ones of the plurality of surfaces.

14. The system claim 1 wherein the printing regime defines an ink for each of the plurality of layers.

15. The system of claim 1 wherein the 3D object gamut mapping module is configured to define a media type for each of the plurality of layers, the system being configured to use the defined media types when forming the 3D object.

16. The system of claim 1 configured to define an ink and media set for each of the plurality of layers.

17. The system of claim 16 wherein the 3D object gamut mapping module is configured to determine a mapping function empirically for each ink and/or media type employed by using at least one calibration 3D object.

18. The system of claim 17 configured to receive data representative of measurements of a number of 3D test pieces, the measurements including data reflective of varying wall angles as measured using a colour measurement device and an illuminant.

19. The system of claim 18, wherein the colour measurement device comprises a colorimeter.

20. The system of claim 17, wherein the mapping function comprises a linear mapping function, a polynomial mapping function or an irregular mapping function.

21. The system of claim 20 wherein, when the mapping function comprises an irregular mapping function, the mapping function is determined using a look-up-table, LUT.

22. The system of claim 1 configured to effect a colour mixing between a printer ink and a natural colour of the media layer in determination of the printing regime.

* * * * *